United States Patent [19]
Tan

[11] Patent Number: 5,811,981
[45] Date of Patent: Sep. 22, 1998

[54] APPARATUS FOR FACILITATING ZERO-INSERTION OF A BURN-IN TEST PROBE INTO A SOCKET

[76] Inventor: Yin Leong Tan, Block 22, St. George's Road #25-182, Singapore, Singapore, 321022

[21] Appl. No.: 615,043

[22] Filed: Mar. 12, 1996

[30] Foreign Application Priority Data

Dec. 20, 1995 [SG] Singapore ............................ 9502240-6

[51] Int. Cl.⁶ .................................................. G01R 31/02
[52] U.S. Cl. ........................................................... 324/758
[58] Field of Search ................................ 324/158.1, 73.1, 324/761, 754, 72.5, 758; 439/482, 266, 912

[56] References Cited

U.S. PATENT DOCUMENTS

| | | | |
|---|---|---|---|
| 4,632,485 | 12/1986 | Brown et al. ............................. | 29/842 |
| 4,853,626 | 8/1989 | Resler ..................................... | 324/754 |
| 4,886,470 | 12/1989 | Billman et al. ......................... | 439/266 |
| 5,283,605 | 2/1994 | Lang-Dahlke .......................... | 324/538 |
| 5,352,130 | 10/1994 | Nagumo .................................. | 439/266 |
| 5,436,570 | 7/1995 | Tan ......................................... | 324/761 |

*Primary Examiner*—Vinh P. Nguyen
*Attorney, Agent, or Firm*—Lawrence Y. D. Ho

[57] ABSTRACT

An apparatus for facilitating zero-insertion of a burn-in test probe having a probe head. The zero-insertion apparatus includes a triggering mechanism, a pressing mechanism, and a sensor which are disposed within the burn-in test probe to facilitate a damage-free insertion of the probe head into an IC socket having a zero-insertion rim. As the probe head is inserted into the socket, the pressing mechanism, being in its locked position, compresses the zero-insertion rim which retracts the socket contacts to allow the probe head to enter the socket unencumbered. When the head is completely in the socket, the sensor becomes actuated. The actuated sensor allows a user to then unlock the pressing mechanism which causes the zero-insertion rim to spring back to its original, undepressed position. The socket contacts revert back to their undepressed position and solid contact is made between the probe head and the contacts.

8 Claims, 10 Drawing Sheets

APPARATUS FOR FACILITATING ZERO-INSERTION OF A BURN-IN TEST PROBE INTO A SOCKET

FIELD OF THE INVENTION

This invention relates to a zero-insertion apparatus, and particularly to a zero-insertion apparatus having a triggering mechanism, a pressing mechanism, and a sensor disposed in a burn-in test probe to facilitate a damage-free insertion of the test probe into an IC socket having a zero-insertion rim.

BACKGROUND OF THE INVENTION

Burn-in test probes are widely used in the integrated circuit ("IC") industry to verify the integrity of the connections between an IC socket and the circuits board on which the IC socket is mounted. These burn-in test probes test the performance of the IC socket and the circuit board assembly under simulated conditions. The burn-in probe has a socket probe head which is physically and functionally similar to an IC device and is electrically coupled to a testing equipment. To test the IC socket, the test probe head is inserted into the IC socket, and the testing equipment conducts an analysis. A detailed description of a burn-in test probe is disclosed in, among others, U.S. Pat. #5,436,570 (Tan).

When using the burn-in test probe, it is imperative that the testing technician exercise high level of care and skill when inserting the probe head into an IC socket. The side contacts which are housed in the socket are fragile, and are easily damaged if the probe head is not inserted in the correct manner. Because the IC sockets are relatively expensive, and also because the testing is conducted toward the end of a manufacturing process, any damage caused during the testing process is highly costly for the manufacturer. But because the testing is often done on a massive scale where speed is an important consideration, it is easy for the technician to emphasize speed over quality. Thus, it is not uncommon for a technician to inadvertently damage the contacts during the insertion process.

Currently, the industry does not have any device for easily reducing or eliminating damage caused to socket contacts during the insertion of the burn-in test probe. However, because the IC industry has recognized the potential for damage when inserting an IC device, there currently exists a device for eliminating damage during the insertion of the IC device. Like the test probe, IC devices can also serious damage the socket contacts during the insertion process. So most sockets currently come with a zero-insertion feature which facilitates damage-free insertion of IC devices. The zero-insertion feature is basically a spring-loaded rim (herein referred to as zero-insertion rim) which, when depressed, retracts the contacts such that an IC device can easily slide in on its own weight—hence the descriptive term "zero-insertion." After the IC device has been fitted, the zero-insertion rim is allowed to spring back to its original, or undepressed, position whereby the contacts are released to make solid contact with the inserted device.

This useful zero-insertion feature is not utilized by the existing burn-in test probes. The current probes do not incorporate the design for accommodating the zero-insertion feature; hence, the user must expend the time and effort to manually create the zero-insertion effect, or worse, simply "force" the probe head into the IC socket. Hence, much skill and time is currently involved in properly inserting the probe without causing damage to the socket contacts. It is, therefore, not surprising that despite the advent of the zero-insertion rim, some percentage of IC sockets are still recalled or thrown away due to damages caused during the burn-in testing stage of the manufacturing process.

In light of this undesirable environment, it would be highly desirable to have an apparatus for facilitating zero-insertion of a burn-in test probe which would significantly eliminate damage to the socket contacts during the insertion of the probe head, thus reducing both the time and skill necessary to complete a burn-in testing process.

OBJECT OF THE INVENTION

It is the object of the present invention to provide an apparatus for facilitating zero-insertion of a burn-in test probe which would significantly eliminate damage to the socket contacts during the insertion of the probe head, and which would reduce the time and skill necessary to complete a burn-in testing process.

SUMMARY OF THE INVENTION

The zero-insertion apparatus for facilitating zero-insertion of a burn-in test probe into an IC socket is disposed in the burn-in test probe having a main body and a probe head. A trigger mechanism is disposed in the main body. The trigger mechanism is coupled to a sensor also disposed in the main body. The sensor has a sensor head which protrudes out from the probe head for sensing the position of the head relative to the IC socket. A pressing mechanism is also disposed in the main body, and includes a set of spring-loaded pressings arms for depressing the zero-insertion rim. The pressing arms are initially locked so that they can compress the zero-insertion rim when the probe head is being inserted. When the sensor head indicates that the head has reached the bottom of the socket, the sensor allows the trigger button to release the pressing arms from their locked position. Thereafter, the pressing arms no longer exerts any force on the already compressed zero-insertion rim, and thus allows the zero-insertion rim to spring back to its original, uncompressed position. The socket contacts revert back to their unretracted position, and mate with the probe head.

BRIEF DESCRIPTION OF THE DRAWINGS

FIGS. 6.1 through 6.5 are pictorial illustrations of the method of employing the zero-insertion apparatus and its corresponding mechanical arrangement.

DETAILED DESCRIPTION OF THE INVENTION

Figure 1:
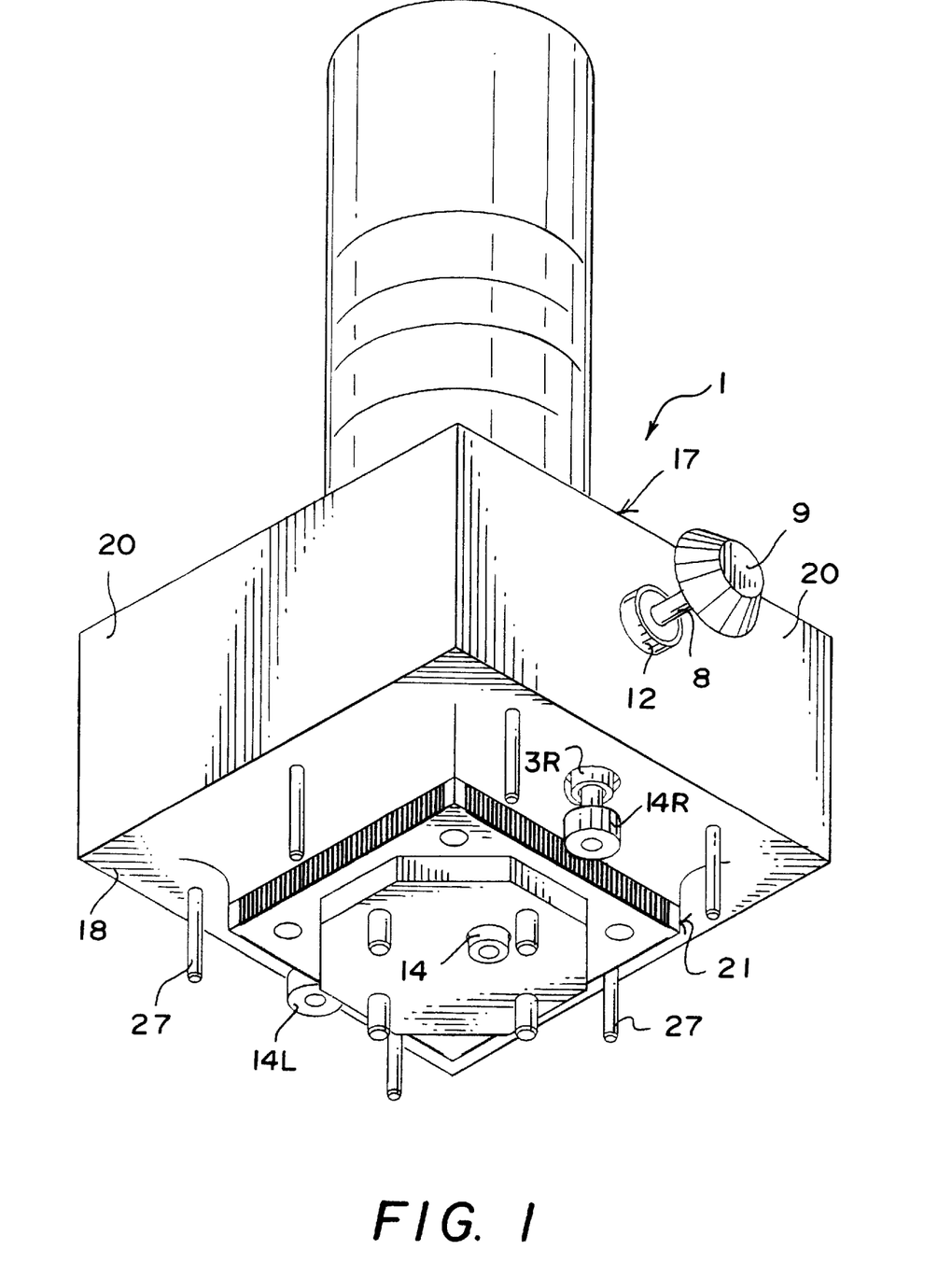
FIG. 1 is an elevational perspective view of the zero-insertion apparatus in a burn-in test probe as seen from the bottom of the probe.
Figure 2:
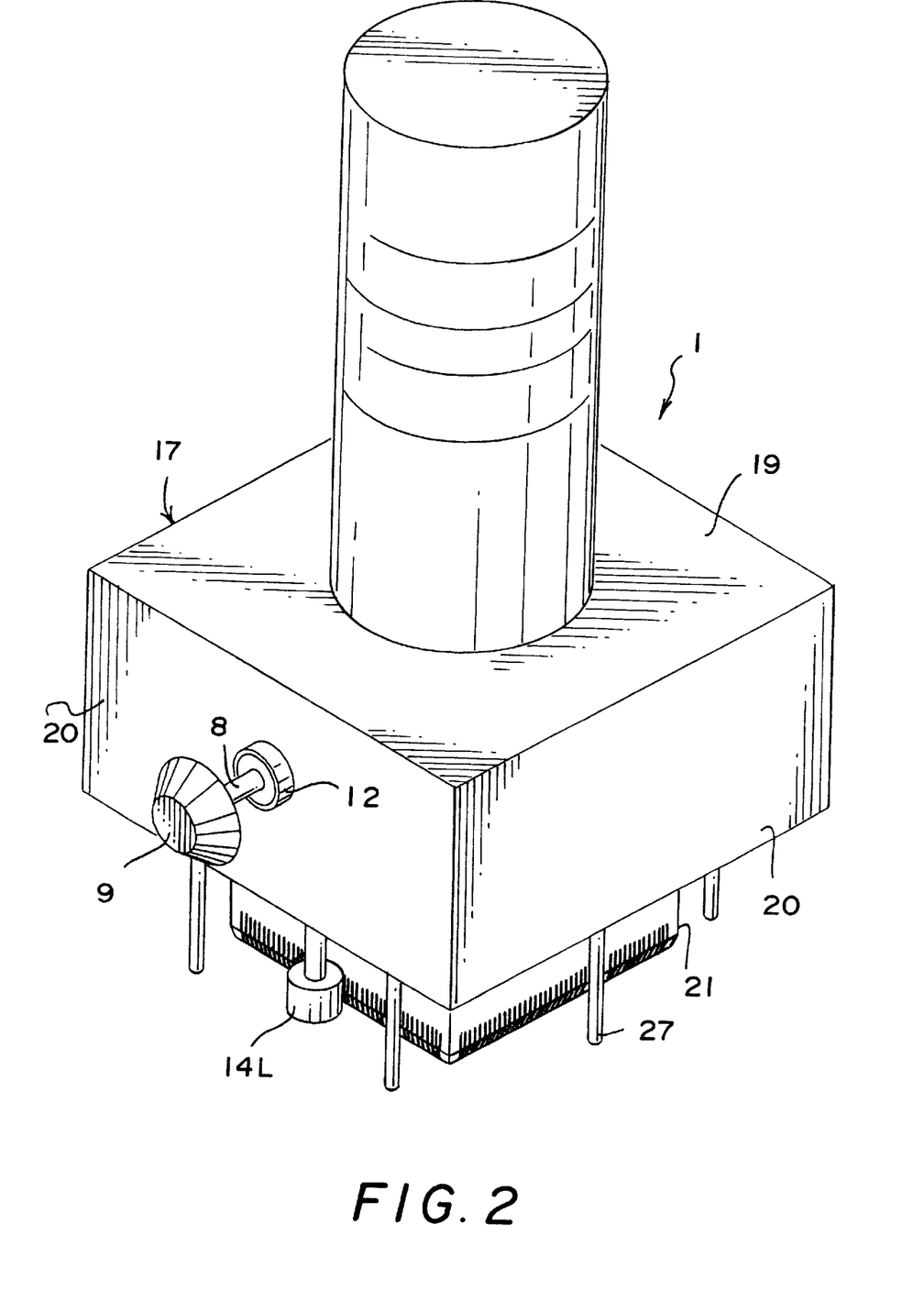
FIG. 2 is an elevational perspective view of the zero-insertion apparatus in a burn-in test probe as seen from the top of the probe.
Figure 3:
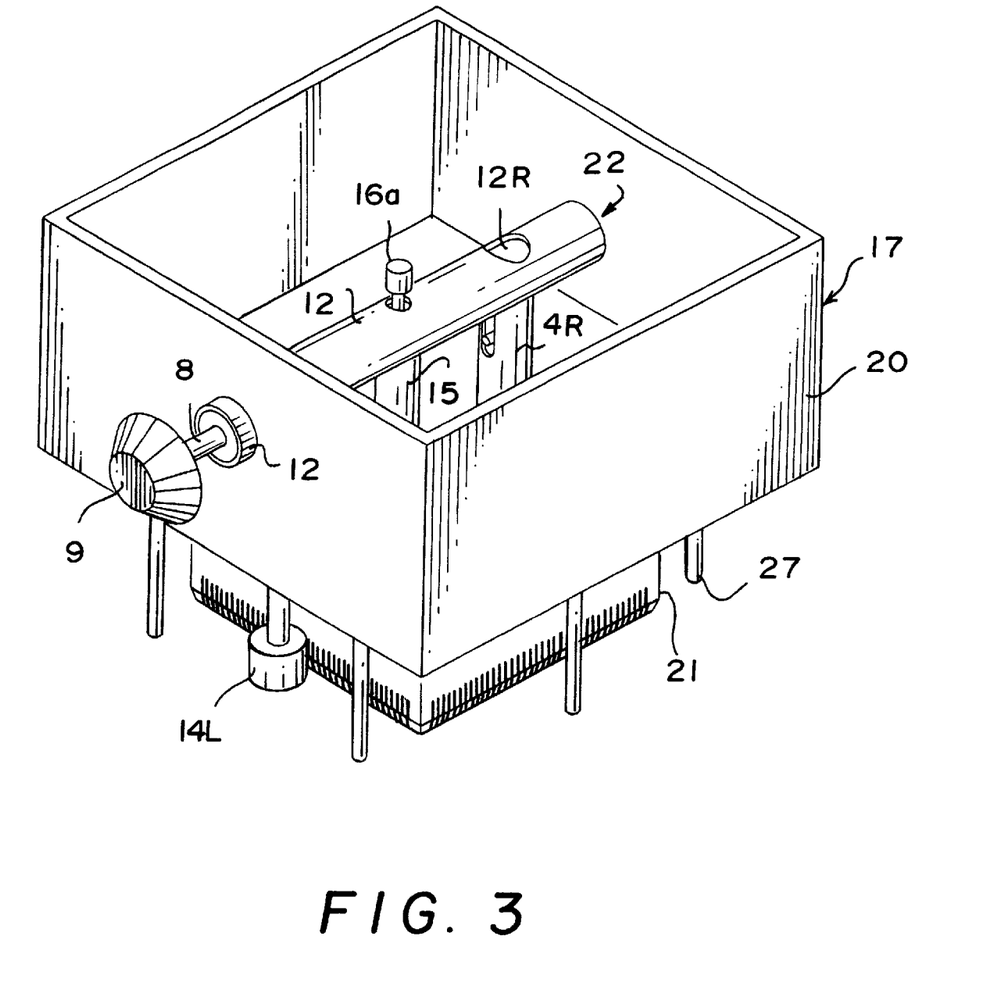
FIG. 3 is an elevational perspective view of the inside of a burn-in test probe having the zero-insertion apparatus as seen from above the probe with its top removed.
Figure 4:
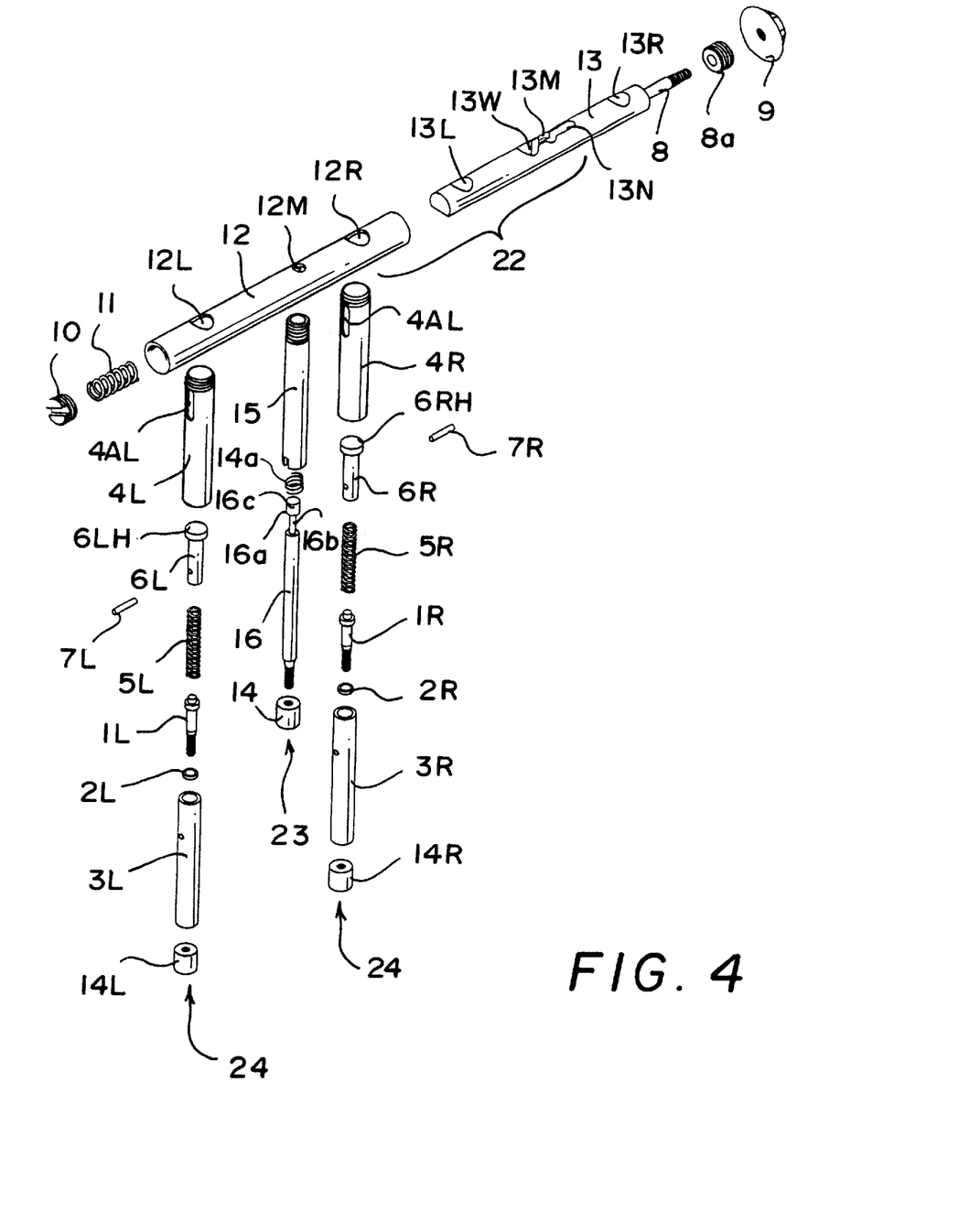
FIG. 4 is an elevational perspective view of the components for the zero-insertion apparatus.
Figure 5:
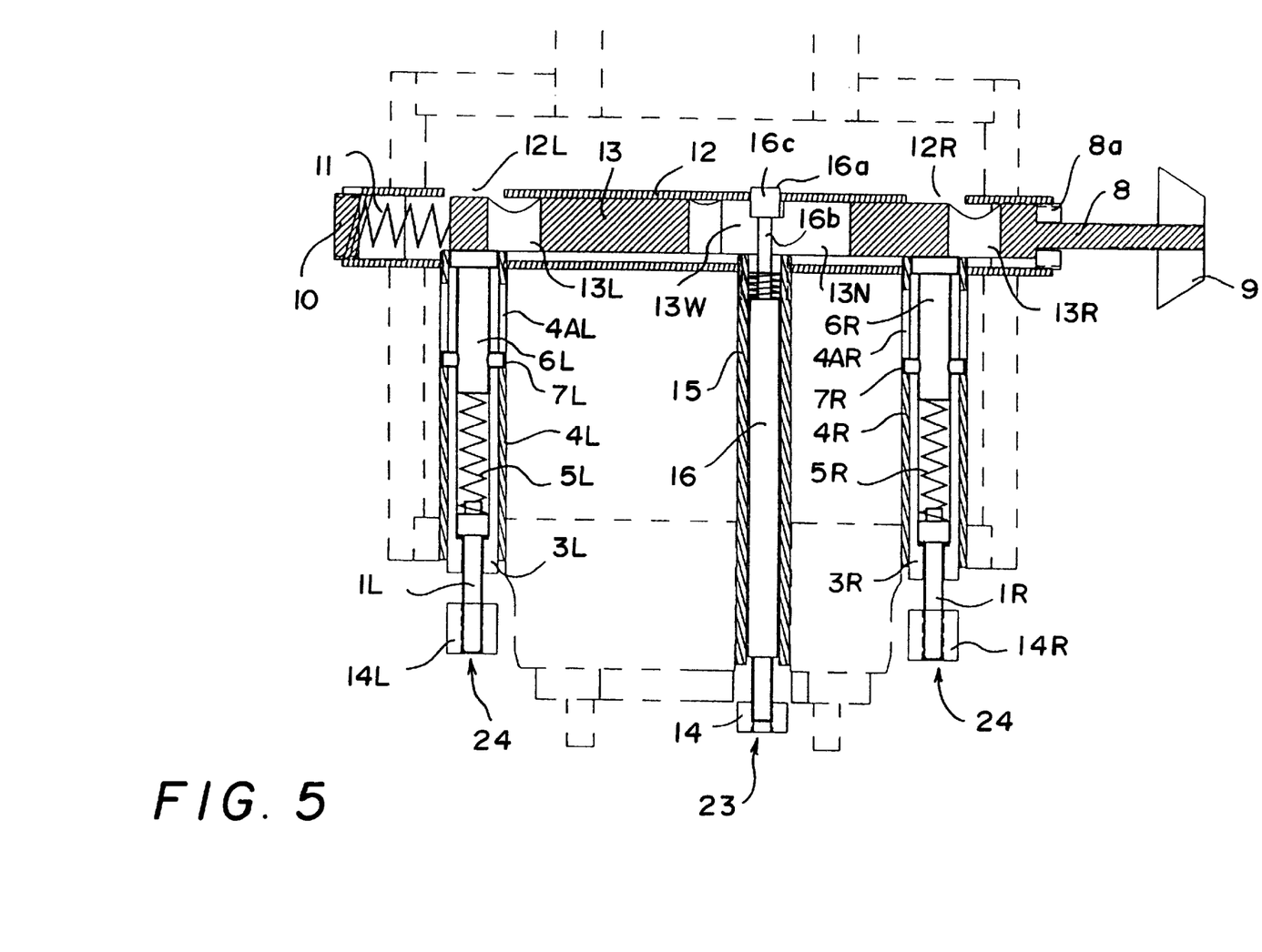
FIG. 5 is a schematic diagram of the zero-insertion apparatus.
Figure 6A:
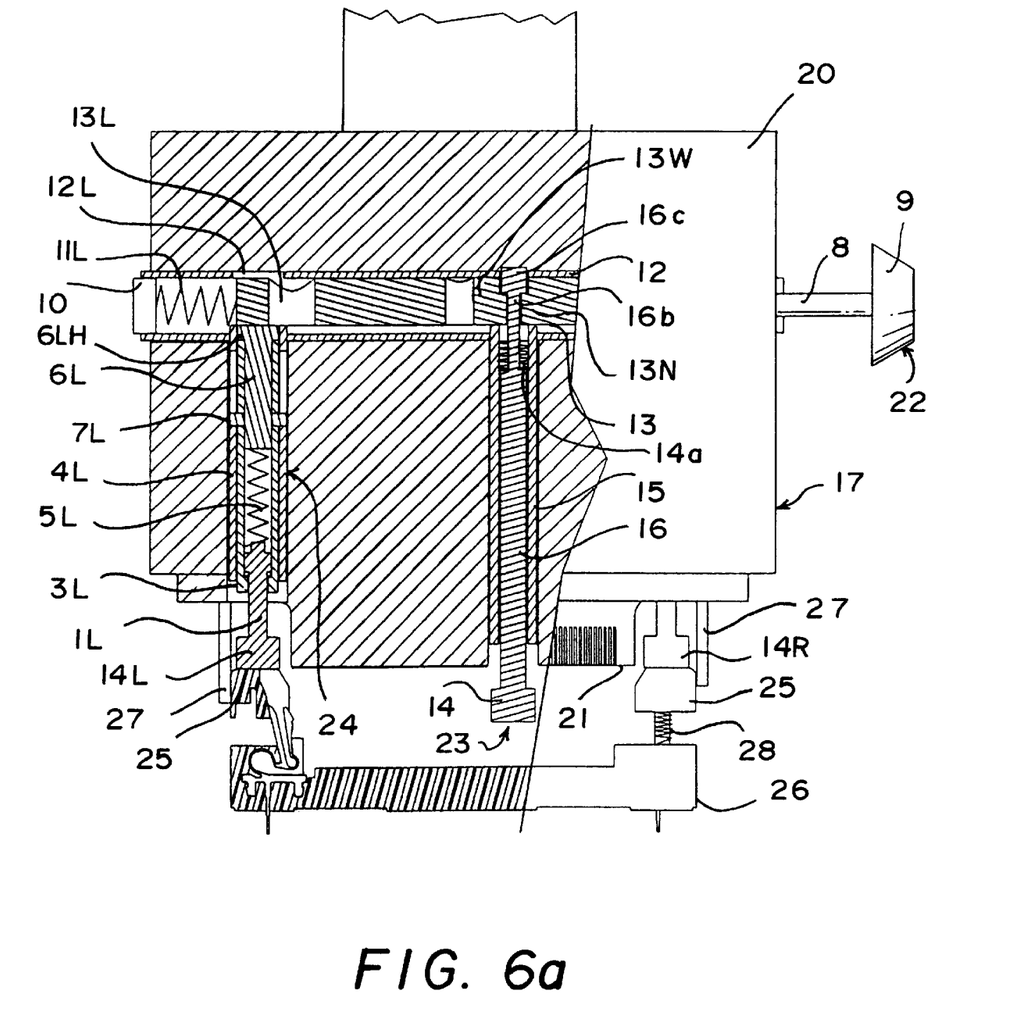
Figure 6B:
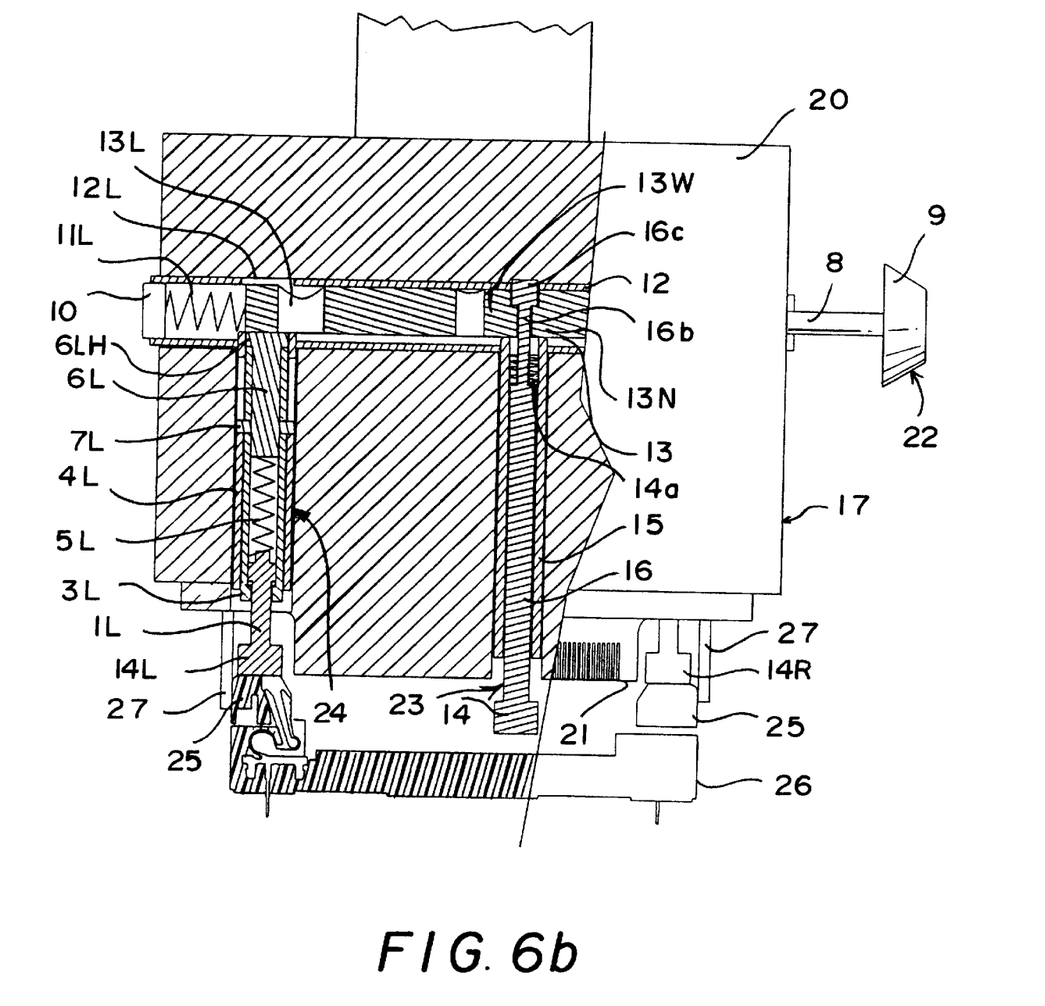
Figure 6C:
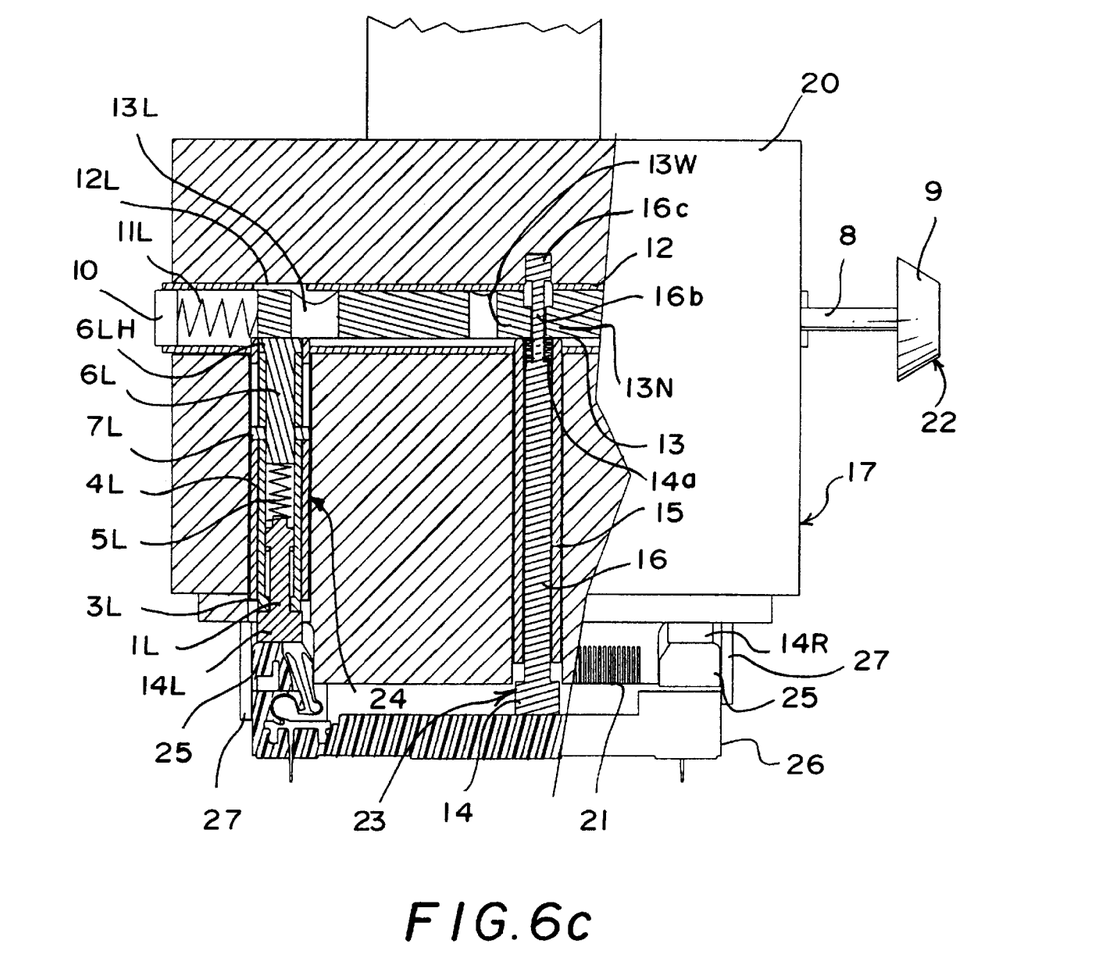
Figure 6D:
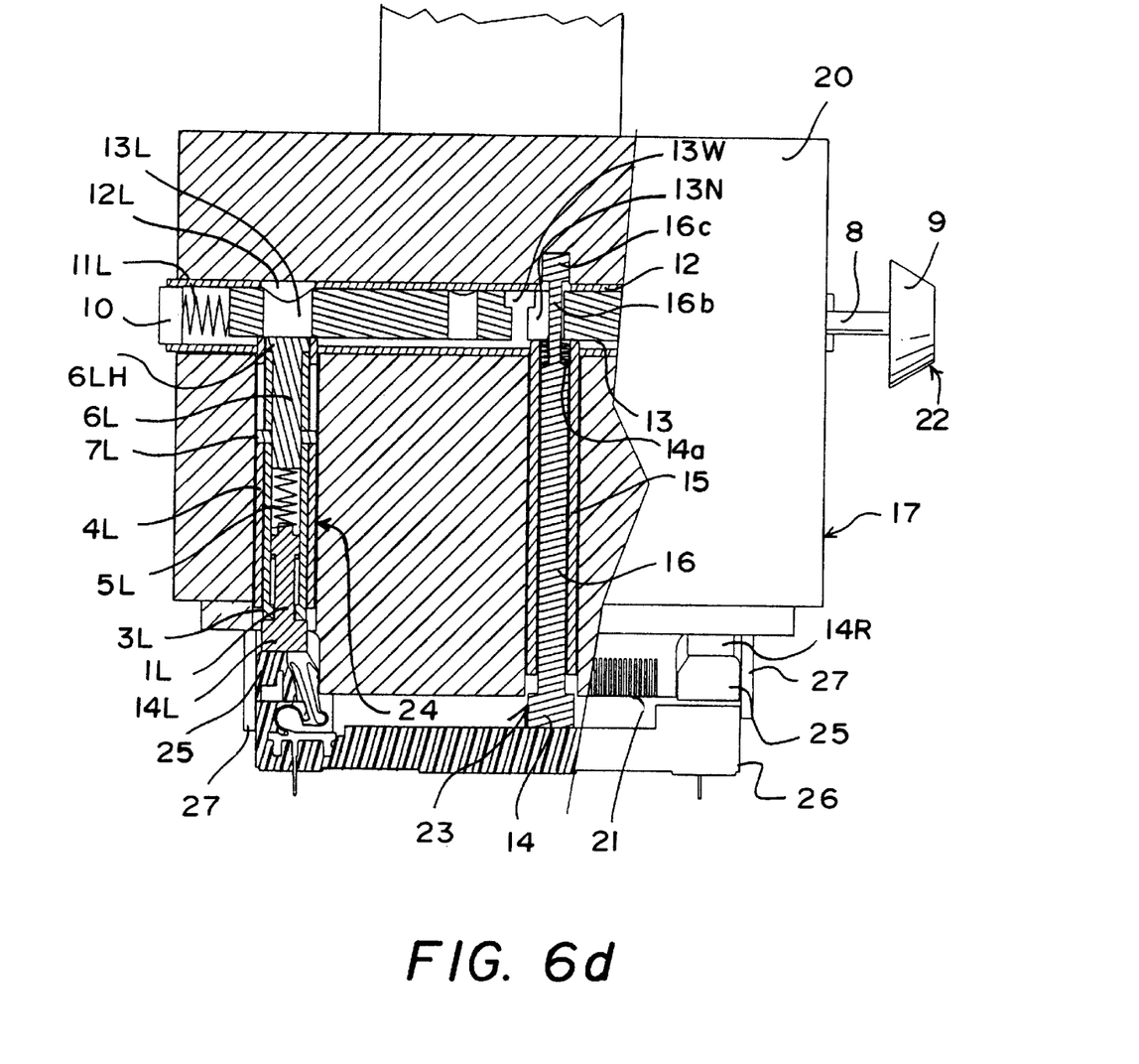
Figure 6E:
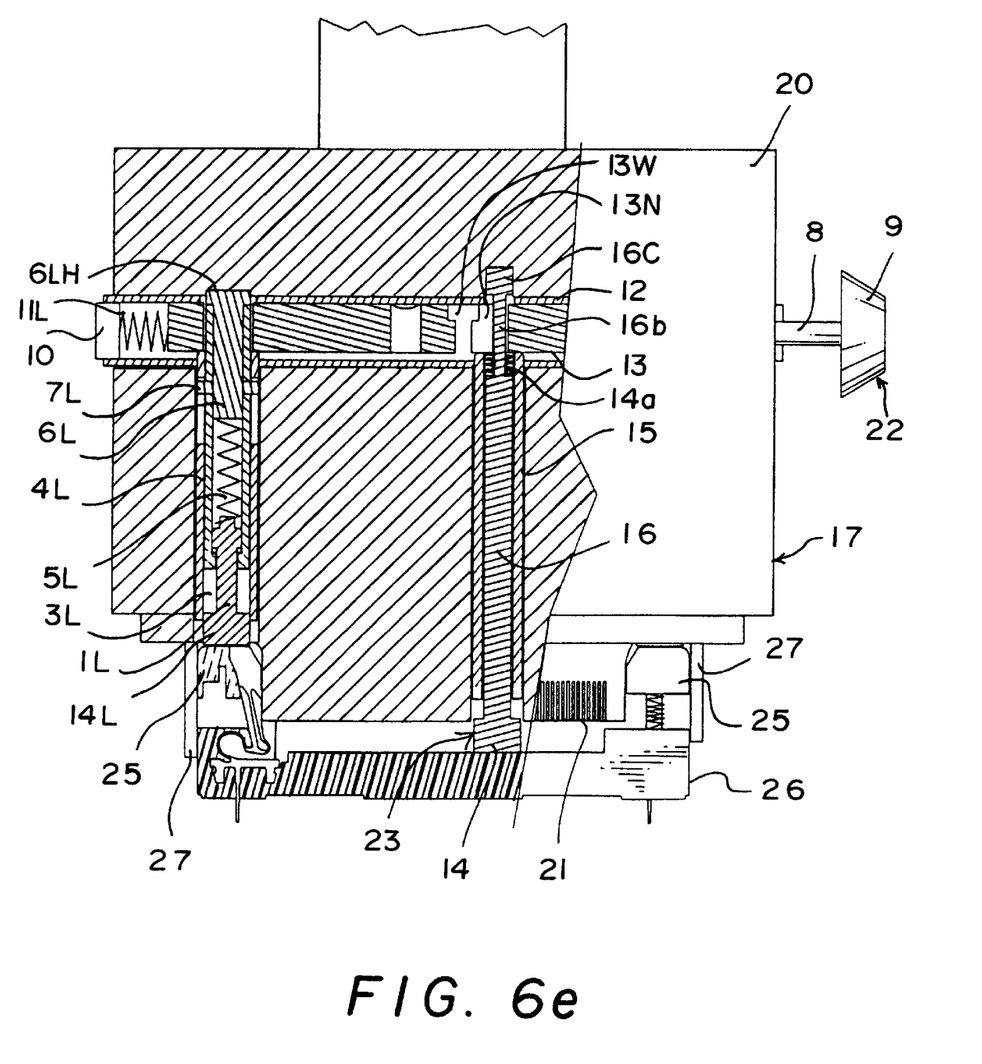

FIGS. 1 through 3 illustrate the preferred embodiment of the zero-insertion apparatus for a burn-in test probe 1 having a main body 17 and probe head 21, the main body having a bottom 18, a top 19, and side walls 20, where the probe head 21 is centered on the bottom 18 of the main body 17.

Referring now to FIGS. 1 through 5, a trigger mechanism 22 is disposed in the main body 17 of the test probe. A main shaft 12 is fixedly displaced between two side walls 20 and a secondary shaft 13 is slidably and concentrically disposed inside the main shaft 12. A trigger button 9 is fixedly attached to the secondary shaft 13 at an end via a screw shaft 8 and a threaded washer 8a. A spring 11 for retracting the secondary shaft 13 to an untriggered position to a triggered position is disposed inside the main shaft 12 between an end cap 10 and the secondary shaft 13.

A left bore 12L and a right bore 12R are disposed in the main shaft 12. A left bore 13L and a right bore 13R are disposed in the secondary shaft. In the untriggered position, the left bore 12L partially overlaps the left bore 13L, and the right bore 12R partially overlaps the right bore 13R. In the triggered position, however, the left and right bores, 12L and 12R, of the main shaft 12 completely overlap the left and right bores, 13L and 13R, of the secondary shaft 13.

A middle bore 12M is disposed in the main shaft 12 between the left bore 12L and the right bore 12R. A middle bore 13M is disposed in the secondary shaft 13 between the left bore 13L and the right bore 13R. The middle bore 13M of the secondary shaft 13 has a narrow portion 13N and a wide portion 13W. In the untriggered position, the wide portion 13W overlaps the middle bore 12M of the main shaft 12; in the triggered position, however, the narrow portion 13N overlaps the middle bore 12M of the main shaft 12.

A sensor 23 includes a support shaft 15 which is fixedly attached to the main shaft 12 at an end and fixedly attached to the probe head 21 at an opposite end. A sensor shaft 16 is slidably and concentrically disposed inside the support shaft 15 and has a threaded head 14 at an end and a latch 16a at an opposite end. The head 14 protrudes out from the probe head 21: The latch 16a is slidably disposed in both the middle bore 12M of the main shaft 12 and the middle bore 13M of the secondary shaft 13. The latch has a stem 16b and a cap 16c. When the sensor is not actuated, i.e., the probe head 21 has not been fully inserted into an IC socket and the sensor head 14 is not fully depressed, the cap 16c occupies the wide portion 13W of the middle bore 13M; when the sensor is actuated, however, i.e., the probe head 21 has been fully inserted into an IC socket and the sensor head 14 is fully depressed, the stem 16c occupies the wide portion 13W of the middle bore 13M. In the unactuated position, the cap 16c, having a radius larger than the narrow portion 13N of the middle bore 13M, prevents the trigger mechanism 22 from triggering by preventing the secondary shaft 13 from laterally sliding. In the actuated position, the stem 16b, having a radius smaller than the narrow portion 13N, allows the trigger mechanism to be triggered by allowing the secondary shaft 13 to laterally slide. A spring 14a is disposed within the support shaft 15 for reloading the sensor shaft to the unactuated, or undepressed, position from the actuated, or depressed, position.

A pressing mechanism 24 consists of a left outer shaft 4L which is fixedly attached over the left bore 12L of the main shaft 12 at an end and fixedly attached to the bottom 8 of the main body 20 at an opposite end; and a right outer shaft 4R which fixedly attached over the right bore 12R of the main shaft 12 at an end and fixedly attached to the bottom 8 of the main body 20 at an opposite end.

A left pressing arm 3L is slidably and concentrically disposed inside the left outer shaft 4L. The pressing arm 3L has a threaded end cap 14L which is fixedly connected to the left pressing arm 3L by a screw 1L and a washer 2L A left peg 6L having a peg head 6LH is slidably disposed at an opposite end of the left pressing arm 3L. In a locked position, the head 6LH is inside the left bore 12L of the main shaft 12, and in a triggered position, the head 6LH is inside the left bores 12L and 13L of both the main shaft 12 and the secondary shaft 13. A pin 7L is firmly attached to the left peg 6L and protrudes out through a elongated bore 4AR to limit the linear movement of the peg 6L Within the left outer shaft 4L to a predetermined range.

A right pressing arm 3R is slidably and concentrically disposed inside the right outer shaft 4R. The pressing arm 3R has a threaded end cap 14R which is fixedly connected to the left pressing arm 3R by a screw 1 R and a washer 2R. A right peg 6R having a peg head 6RH is slidably disposed at an opposite end of the left pressing arm 3R. In a locked position, the head 6RH is inside the right bore 12R of the main shaft 12, and in a triggered position, the head 6RH is inside the right bore 12R and 13R of both the main shaft 12 and the secondary shaft 13. A pin 7R is firmly attached to the right peg 6R and protrudes out through an elongated bore 4BR to limit the linear movement of the peg 6R within the right outer shaft 4R to a predetermined range.

The heads 6LH and 6RH are positioned such that the sliding movement of the secondary shaft 13 brushes against the top surface of the head. Over time, the surface may experience significant wear and tear. Thus, although the head may be made of various hard, solid materials, it is preferred that the head be made of particularly wear-resistant material such Teflon. Or in the alternative, a thin layer of wear-resistant material may be bonded to the top of the head.

A spring 5L is disposed between the pressing arm 3L and the left peg 6L, and a spring 5R is disposed between the pressing arm 3R and the right peg 6R. The combined force of the springs 5L and 5R should be greater than the total force exerted by the zero-insertion rim.

To make the insertion process easier, a pin guide 27 made up of plurality of pins such as the one shown in FIGS. 1 and 2 may be placed on the bottom 18 of the test probe. The pins should be spaced such that they fit snugly around the edges of the IC socket. Although the guide is preferred to be made of a plurality of pins, it should be understood the guide may by made of other objects such as rods, blocks, or solid walls.

FIGS. 6.1 through 6.5 illustrate the steps for using the zero-insertion apparatus to facilitate zero-insertion of a burn-in test probe, and the mechanical arrangement corresponding to the respective steps. Because the mechanical arrangement for the left and right pressing mechanisms are identical, only the left one will be shown though both will be described.

In FIG. 6.1, the test probe head 21 is inserted into the IC socket 26 until the end caps 14L and 14R (only one shown) of the pressing arms 3L and 3R rest squarely against the zero-insertion rim 25. At this point, the trigger mechanism 22 is in its locked position with the left bore 13L and the right bore 13R of the secondary shaft only partially overlapping the left bore 12L and the right bore 12R of the main shaft 12. The peg heads 6LH and 6RH of the pressing mechanism 24 are, therefore, blocked from moving upward and the pressing mechanism 24 remains in its locked position. At this stage, neither the zero-insertion rim 25 nor the pressing mechanism 24 is compressed, and the sensor 23 is at its original, or undepressed or unactuated, position such that the spring 28 is fully visible.

In FIG. 6.2, force is applied against the test probe in a direction co-linear to the direction of insertion until the zero-insertion rim 25 is fully depressed to retract the socket contacts where the spring 28 is no longer visible. Because the combined spring force of 5L and 5R is greater than the spring force exerted by springs 28 in the zero-insertion rim 25, the pressing arms 3L and 3R do not compress during the step in FIG. 6.2. Also, because the left bore 13L and the right bore 13R of the secondary shaft are still partially overlapping the left bore 12L and the right bore 12R of the main shaft 12, the pressing mechanism 24 is still in its locked position. At this point, the sensor head 14 has not reached the bottom of the socket, and thus it is still in the undepressed position. Because in the undepressed position, the cap 16b of the sensor latch 16a prevents the lateral movement of the secondary shaft 13, the trigger button 9 cannot be depressed, and thus the trigger mechanism 22 cannot be triggered at this point. This feature is important because the probe head 21 is not at the level of the socket contacts in this position, and inadvertent triggering must be avoided lest the socket contacts may be damaged.

In FIG. 6.3 additional force, enough to overcome the combined spring force of springs 5L and 5R, is applied against the test probe in the same direction as in FIG. 6.2 until the probe head 21 is fully inserted into the socket 26. Since the zero-insertion rim 25 is already fully depressed, the additional force causes the pressing arms 3L and 3R to be compressed. Because the probe head 21 is now at the bottom of the socket 26, the sensor head 14 is fully depressed. The cap 16b of the sensor latch 16a which was preventing the sliding of the narrow portion 13N of the middle bore 13M is now repositioned such that the narrower stem 16c of the sensor latch 16a now occupies the position previously occupied by the cap 16b. Because the radius of the stem 16c is narrower than the radius of the narrow portion 13N, the secondary shaft 13 can now slide laterally in the event that the trigger button 9 is depressed. The trigger mechanism 22 can now be triggered.

In FIG. 6.4, the trigger button 9 is depressed. This motion causes the secondary shaft 13 to slide into its triggered position where the left bore 13L and the right bore 13R of the secondary shaft 13 completely overlap the left bore 12L and the right bore 12R of the main shaft 12. This opens up a clear path for the peg heads 6LH and 6RH to move up vertically, hence releasing the pressing arms 3L and 3R from their locked position to the released, or triggered, position.

FIG. 6.5 illustrates the final position. The peg heads 6LH and 6RH are now in left and right bores 12L and 13L and 12R and 13R, respectively. The spring 11L causes the secondary shaft to exert pressure against the left and right peg heads 6LH and 6RH, and thus prevents the pressing arms 3L and 3R from retracting back. The zero-insertion rim is now released to its original undepressed position and the socket contacts are returned to their original, or unretracted, position. The probe head 21 is now in full contact with the socket contacts, and the insertion process is completed.

When the testing process is completed, the probe head 21 is disengaged from the IC socket 26 via a gentle pulling motion, and the zero-insertion apparatus is reset to its original position by a slight push of the trigger button 9. The pushing motion temporarily alleviates the pressure exerted by the secondary shaft 12 on the peg heads 6LH and 6RH, causing the pressing arms 3L and 3R to spring back to their initial position. The zero-insertion apparatus is now ready to be inserted once more.

It should be understood by those skilled in the art that the preferred embodiment described herein can take on multiple forms. For instance, the zero-insertion apparatus need not be physically attached to the burn-in test probe in order to facilitate zero-insertion. Instead, it may be a separate device which can depress the zero-insertion rim before placing the burn-in test probe over the IC socket. After the rim is depressed, the burn-in probe head can be inserted into the socket. Thereafter, the rim may be released to complete the insertion process. The important principle is that the zero-insertion rim must be depressed before the probe head is in position to mate with the IC socket contacts.

Hence it should be appreciated by those skilled in the art that various modifications, additions and substitutions are possible for the preferred embodiment without departing from the scope and spirit of the invention as disclosed in the accompanying claims.

I claim:

1. A zero-insertion apparatus for a burn-in test probe for facilitating zero-insertion of said test probe into an IC socket having a zero-insertion rim and side socket contacts, said test probe having a probe head configured for insertion into said IC socket and mating with said socket contacts, said apparatus comprising:

a trigger mechanism disposed in said burn-in test probe;

a sensor means disposed in said test probe, said sensor means coupled to said trigger mechanism and adapted for sensing a position of said head relative to said socket and communicating to the trigger mechanism of said position; and a pressing means for depressing said zero-insertion rim, said pressing means slidably disposed in said burn-in test probe and coupled to the trigger mechanism, whereby said pressing means is locked during an insertion of said probe head into the socket and is released by said trigger mechanism when the probe head has reached a desired position as determined by said sensor means.

2. The zero-insertion apparatus as recited in claim 1 further comprising a guide fixedly disposed on said test probe for guiding an insertion of said probe head into said socket.

3. The zero-insertion apparatus as recited in claim 2 wherein said guide comprises a plurality of pins.

4. A zero-insertion apparatus for a burn-in test probe for facilitating zero-insertion of said test probe into an IC socket having a zero-insertion rim and side socket contacts, said test probe including a main body and a probe head, said main body having a bottom, a top, and side walls, and said probe head being configured for insertion into said IC socket and mating with said contacts, said probe head disposed on the bottom of said main body, said zero-insertion apparatus comprising:

(a) a trigger mechanism disposed in said main body of said test probe, said trigger mechanism comprising
      a main shaft fixedly displaced between two side walls,
      a secondary shaft slidably and concentrically disposed inside said main shaft,
      a trigger button fixedly attached to said secondary shaft at an end via a screw shaft,
      an end cap fixedly attached to said secondary shaft at an end opposite to said trigger button;
      a spring for retracting said secondary shaft to an untriggered position from a triggered position,
      a left bore and a right bore disposed in the main and secondary shafts, said left and right bore of said main shaft partially overlapping said left and right bore of the secondary shaft in the untriggered position, and said left and right bore of said main shaft completely overlapping said left and right bore of the secondary shaft in the triggered position, and a middle bore disposed in the main shaft and the secondary shaft between said left bore and said right bore, said middle bore of the secondary shaft having a narrow portion and wide portion, said wide portion overlapping said middle bore of the main shaft in the untriggered position, and said narrow portion overlapping said middle bore of the main shaft in the triggered position;

(b) a sensor means protruding out from the said probe head, said sensor means comprising a support shaft fixedly attached to said main shaft at an end and fixedly attached to said probe head at an opposite end, a sensor shaft slidably and concentrically disposed inside said support shaft, said sensor shaft having a sensor head at an end and a latch at an opposite end, said head protruding out from the probe head and said latch disposed in the middle bore of the main shaft and the secondary shaft, said latch having a stem and a cap, said cap adapted for preventing a lateral sliding movement of said narrow portion of the middle bore, and said stem adapted for allowing said movement;

a spring for retracting said sensor shaft to an undepressed position from a depressed position; and (c) a pressing means, said pressing means comprising a left outer shaft fixedly attached over said left bore of said main shaft at an end and fixedly attached to the bottom of the test probe at an opposite end, said left outer shaft having a left elongated bore, a right outer shaft fixedly attached over said right bore of said main shaft at an end and fixedly attached to the bottom of the test probe at an opposite end, said right outer shaft having a right elongated bore, a left pressing arm slidably and concentrically disposed inside said left outer shaft, said pressing arm having an end cap attached to said left pressing arm by a screw, said end cap protruding out from the bottom of the test probe adjacent to the probe head, a left peg slidably disposed inside said left outer shaft, said peg having a head, said head disposed inside the left bore of the main shaft in a locked position and inside the left bore of both the main shaft and the secondary shaft in a released position, a right pressing arm slidably and concentrically disposed inside said right outer shaft, said pressing arm having an end cap attached to said right pressing arm by a screw, said end cap protruding out from the bottom of the test probe adjacent to the probe head, a right peg slidably disposed inside said right outer shaft, said peg having a head, said head disposed inside the right bore of the main shaft in a locked position and inside the right bore of both the main shaft and the secondary shaft in a released position, a left spring disposed inside said left pressing arm between said screw and said left peg, a right spring disposed inside said right pressing arm between said screw and said right peg, said left and right springs capable of exerting a combined spring force greater than the total force exerted by the zero-insertion rim, and a left pin firmly attached to said left peg, said pin protruding out through the left elongated bore to limit a linear movement of said left peg, and a right pin firmly attached to said right peg, said pin protruding out through the right elongated bore to limit a linear movement of said right peg.

5. The apparatus as recited in claim 4 further comprising a pin guide.

6. The apparatus as recited in claim 4 wherein said peg head is made of wear-resistant material.

7. The apparatus as recited in claim 6 wherein said wear-resistant material is Teflon.

8. A damage-free method of inserting a burn-in test probe into an IC socket using a zero-insertion apparatus, said IC socket having a zero-insertion rim and side socket contacts, said test probe having a probe head configured for insertion into said IC socket and mating with said socket contacts, said apparatus comprising a trigger mechanism disposed in said burn-in test probe;

a sensor means disposed in said test probe, said sensor means coupled to said trigger mechanism and adapted for sensing a position of said head relative to said socket and communicating to the trigger mechanism of said position; and a pressing means for depressing said zero-insertion rim, said pressing means slidably disposed in said burn-in test probe and coupled to the trigger mechanism, whereby said pressing means is locked during an insertion of said probe head into the socket and is released when the probe head has reached a desired position as determined by said sensor means, said method comprising:

a) placing said test probe partially in said IC socket;

b) depressing said zero-insertion rim with said pressing means until said zero-insertion rim is fully depressed;

c) pressing said test probe such that said probe head is in position to mate with said socket contacts without releasing said zero-insertion rim, whereby said sensor means places said trigger mechanism in position to trigger; and d) triggering said trigger mechanism, whereby said zero-insertion rim returns to its undepressed position and said probe head mates with said socket contacts.

* * * * *